March 22, 1966 R. L. GOLDMAN ETAL 3,242,395

SEMICONDUCTOR DEVICE HAVING LOW CAPACITANCE JUNCTION

Filed Jan. 12, 1961 2 Sheets-Sheet 1

INVENTORS
RICHARD L. GOLDMAN
JAMES P. SPRATT
BY

Herbert Epstein
AGENT

INVENTORS
RICHARD L. GOLDMAN
JAMES P. SPRATT
BY
Herbert Epstein
AGENT

United States Patent Office 3,242,395
Patented Mar. 22, 1966

3,242,395
SEMICONDUCTOR DEVICE HAVING LOW CAPACITANCE JUNCTION

Richard L. Goldman, Horsham, and James P. Spratt, Yeadon, Pa., assignors, by mesne assignments, to Philco Corporation, Philadelphia, Pa., a corporation of Delaware Filed Jan. 12, 1961, Ser. No. 82,286
13 Claims. (Cl. 317—235)

This invention relates to semiconductor devices comprising a semiconductive body and a p-n junction rectifier electrode therein, which exhibit the desirable properties of point-contact devices and tunnel diodes but are free from some of their undesirable properties.

In recent years, many types of high-frequency diodes have been developed, among which are the mixer diode, the tunnel diode and the variable-capacitance diode. The maximum frequency at which each of these diodes can be operated efficiently is inversely dependent on the capacitance of the rectifying contact of the diode. Since this capacitance is directly dependent on the area of the rectifying contact, the maximum frequency at which the diode can be operated efficiently also is inversely dependent on this area. Heretofore low capacitances have been obtained in mixer and parametric diodes by employing point contacts. Low junction capacitances have been obtained in tunnel diodes (comprising for example an n-type region alloyed into the surface of a heavily doped p-type germanium body) by etching away all but a small needle-like column of the p-type germanium body abutting the p-n junction. These point-contact and alloy-junction structures are relatively unsatisfactory because they are mechanically weak and unstable. In particular the needle-like column of germanium in the tunnel diode is easily fractured by small thermal stresses and the slight mechanical deformations encountered for example in assembling the diode. Similarly points of small diameter, e.g., a few microns, are easily deformed and blunted by the forces applied in assembling point-contact diodes. Moreover, to obtain such fine points, it is necessary to use very small diameter wire which has a resistance and inductance per unit length higher than the resistance and inductance of larger-diameter wires usable in making connections to conventional alloy-junction electrodes. Such higher resistance and inductance are undesirable in a high-frequency device. In addition to these mechanical difficulties, point-contact diodes are disadvantageous because they often have undesirably high noise figures—substantially higher than those of conventional alloy-junction rectifier contacts. Accordingly it would be desirable to have a junction electrode the area of whose rectifying contact with the semiconductive body is comparable to the area of a small point contact, which is mechanically stable and to which a lead wire whose diameter is considerably greater than that of the point contact can be bonded. Heretofore however, the art has not known how to fabricate such a junction electrode.

Accordingly an object of the invention is to provide a semiconductor device having a junction rectifier contact whose rectifying area may be comparable to that of a point contact.

Another object is to provide a semiconductor device having a junction rectifying contact characterized by an unusually low capacitance.

Another object is to provide a semiconductor device having a junction rectifying contact whose rectifying area is comparable to that of a point contact but which is substantially more stable mechanically than a point contact.

Another object is to provide such a device, to whose rectifying contact may be bonded a lead wire having a diameter considerably larger than that of a point contact.

Another object is to provide a diode comprising such a rectifying contact.

Another object is to provide a diode comprising such a rectifying contact, which has a lower noise figure than a point-contact diode of comparable capacitance.

Another object is to provide tunnel diodes and mixer diodes of the foregoing type.

Another object is to provide a voltage-variable capacitance diode whose capacitance changes abruptly from a given capacitance to a much smaller capacitance in response to only a small change in a control voltage applied thereto.

Another object is to provide a diode which is readily fabricated by conventional manufacturing techniques.

These objects are achieved by a semiconductive device which includes a body of semiconductive material having opposing surfaces and comprising a region extending continuously between and intersecting both of these opposing surfaces. This region has a conductivity type opposite that of the portion of the body adjoining it and hence forms a rectifying junction with that portion. In addition, and in accordance with the invention, this region has a surface area within the semiconductive body less than the area of intersection of the region and either opposing surface of the body.

In one specific form, the device according to the invention comprises a body of semiconductive material of given conductivity type in which a web is formed having a thickness of between about 0.01 and 0.1 mil. A region of conductivity type opposite said given type extends through a portion of this web, intersecting both opposing surfaces thereof. Typically this region is circularly cylindrical in form and has a cross-sectional diameter of the order of 1 to 10 mils. It may be produced by alloying a body of metal of impurity type opposite that predominant in the web entirely through the web. In such a structure, the area of the rectifying junction is that of the lateral surface of the alloyed-through region. The portion of the region intersecting either surface of the web is the cross-section of the cylindrical region. In accordance with the invention, the thickness of the web is less than one-fourth of the diameter of the cross-section of the cylindrical region. Under these conditions the area of the lateral surface of the cylindrical region (and hence of the rectifying contact) is less than the cross-sectional area of the region. As a result the rectifying contact according to the invention has a lower capacitance than conventional alloy-junction contacts having the same cross-sectional area.

For example, where the semiconductor web is 0.01 mil thick and the cross-sectional diameter of the alloy region is 1 mil, the lateral area of the region is only $\frac{1}{25}$ of its cross-sectional area and is equal to that of a point-contact of 0.2 mil diameter, i.e., only about 5 microns. Because the lateral area of the alloy region acts as the rectifying surface instead of its cross-sectional area as in a conventional p-n junction device, and because the capacitance of the rectifying contact is directly proportional to its area, the rectifying contact of the invention exhibits a capacitance only $\frac{1}{25}$ of that exhibited by a conventional p-n junction device having a 1 mil cross-sectional diameter. Because the cross-sectional diameter of the alloy region is 5 times as large as that of a point contact of equal rectifying area, a lead wire whose diameter is five times larger than the minimum diameter of the point may be affixed thereto. Hence the series resistance and inductance of the lead wire may be smaller than that used for a point contact of equal rectifying area. Because the alloyed-through region is integral with the semi-conductive body in which it is formed it is mechanically more stable than either a point contact of equal rectifying area or a p-n junction device of the type in which the germanium body is etched down to a needle-like column.

Other advantages and features of the invention will become apparent from a consideration of the following detailed description taken in connection with the accompanying drawings, in which.

Figure 1:
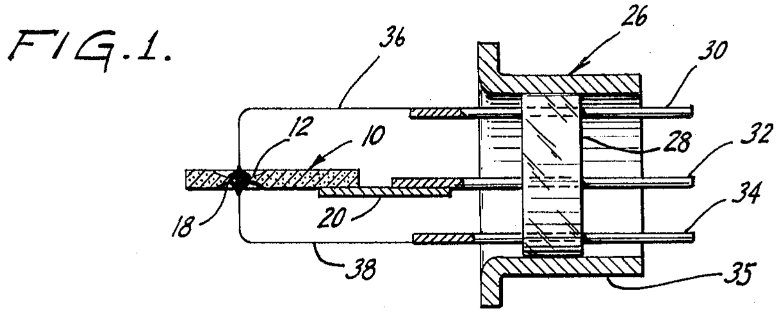
FIGURE 1 is a diagram of a vertical section of a tunnel diode according to the invention.
Figure 2:
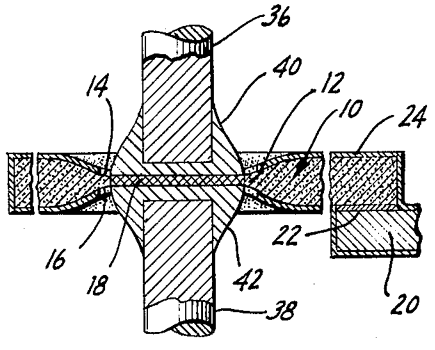

The tunnel diode according to the invention illustrated in FIGURES 1 and 2 comprises a rectangular wafer 10 of semiconductive material, e.g., substantially monocrystalline n-type germanium having a resistivity of about 0.001 ohm-centimeter. Wafer 10 is about 150 mils long, about 75 mils wide and about 4 mils thick, and has formed therein a web-like base region 12 whose respective surfaces 14 and 16 preferably are substantially plane and are spaced from one another by a very small distance, e.g., between about 0.01 mil and 0.1 mil. In accordance with the invention, a cylindrical region 18 of conductivity type opposite that of wafer 10, i.e., p-type, having a cross-sectional diameter more than four times greater than the thickness of web 12 is formed in web 12. Typically the cross-sectional diameter of region 18 is between about one and ten mils, and the region is formed by alloying completely through web 12 a p-type impurity material, e.g., an alloy consisting essentially of indium and gallium in which the gallium content is between about 0.1 and about 1 percent by weight. A preferred process for fabricating this region is described hereinafter.

To provide a substantially ohmic connection to the germanium wafer, a nickel base tab 20 is bonded thereto by a solder layer 22 preferably containing a donor material. For example layer 22 may consist of tin, lead containing 0.5 percent by weight of arsenic or lead containing 2 percent by weight of antimony.

To reduce the series resistance $r_s$ of the diode, a layer 24 of a substance having an electrical conductivity much higher than that of wafer 10 is applied to the surface thereof continuously between base tab 20 and a line adjacent but spaced from the alloy-junction region 18. This resistance-reducing layer may be a layer of gold applied to the surface of wafer 10 in a manner described hereinafter.

To provide external electrical connections to wafer 10 and alloy-junction region 18, a stem assembly 26 is provided comprising a glass cylinder 28 in which are embedded nickel-plated copper stem leads 30, 32 and 34 arranged parallel to the axis of the stem, and a flanged metal shell 35 which tightly surrounds the glass stem. The base tab 20 is spot-welded to the center stem lead 32, and electrical connections are made to the alloy-junction region 18 by lead wires 36 and 38 having one of their ends welded to peripheral stem leads 30 and 34 respectively and having their other ends bonded to the opposite faces of region 18 by solder fillets 40 and 42. As discussed more fully hereinafter, lead wires 36 and 38 preferably are bonded to region 18 during its formation.

In the structure just described, rectification occurs at a rectifying barrier substantially coincident with the lateral surface of region 18 within web 12. The area of this surface is substantially equal to ($\pi$ x thickness of web 12 x cross-sectional diameter of region 18). In accordance with the invention, the thickness of web 12 is substantially less than one-fourth of the cross-sectional diameter of region 18. Accordingly the area of the rectifying barrier is substantially less than the cross-sectional area of region 18. Hence the diode exhibits capacitances comparable to those of point contact devices, although the cross-sectional diameter of the region is comparable to those of alloy junctions of conventional form, whose capacitances are many times higher than those of the diode of the invention.

The following procedure has been found to be suitable for fabricating the tunnel diode illustrated in FIGURES 1 and 2. One end of nickel base tab 20 is soldered to germanium wafer 10 with one of the aforementioned solders, and the other end of tab 20 is welded to stem lead 32. Then web 12 is formed by directing substantially coaxial jets of electrolyte (not shown) perpendicularly against the opposing surfaces of wafer 10 and applying a potential difference between these jets and base tab 20 biasing wafer 10 anodically. In the specific process here described the electrolyte is an indium-plating solution. Under these conditions the surfaces of wafer 10 are anodically etched.

After the wafer has been etched sufficiently to reduce the thickness of web 12 to the desired value, the polarity of the applied potential difference is reversed and indium disks 44 and 46 (see FIGURE 3) are electrodeposited upon the freshly etched surfaces. An indium plating process suitable for forming disks 44 and 46 is described and claimed in copending application Serial No. 852,162, now United States Patent No. 3,032,484, filed November 12, 1959, by Donald P. Sanders, issued May 1, 1962, and entitled, "Jet-Plating Method of Manufacture of Micro-Alloy Transistors." Accordingly, no further discussion of this process is deemed necessary herein.

Solder globules 48 and 50 consisting essentially of indium containing between about 0.1 and 1 percent by weight of gallium now are affixed to lead wires 36 and 38. This may be done by electroplating the globules onto the ends of the lead wires by the processes described and claimed in United States Patent No. 2,931,758 to E. M. Zimmerman and United States Patent No. 2,818,375 to G. L. Schnable. Then wires 36 and 38 are crimped and the other ends thereof are spot-welded to stem leads 30 and 34 in a manner such that globules 48 and 50 abut indium disks 44 and 46 respectively. In this regard, while merely one lead wire would be sufficient to provide an electrical connection to alloy region 18, two lead wires are abutted thereagainst in the manner shown in FIGURE 3 in order to apply approximately equal and opposite forces against web 12 and thereby avoid an excessively large unbalanced force on web 12 which might fracture it.

Alloy region 18 then is formed, and concurrently wires 36 and 38 are bonded to opposing surfaces thereof, by heating globules 48 and 50 for a time and at a temperature sufficient to melt them and cause them to dissolve indium disks 44 and 46 and the portion of germanium web 12 therebetween. The indium of disks 44 and 46 serves to confine this dissolution to the region of the web therebetween. The heat may be applied conductively via lead wires 36 and 38, or it may be applied radiatively. Preferably it is applied while the assembly is immersed in an inert atmosphere, e.g., of argon gas.

Thereafter the heating is discontinued and the molten region is permitted to cool below its solidus temperature. During this cooling the recrystallized p-type region 18 forms. The region consists primarily of germanium heavily doped with gallium and less heavily doped with indium. Concurrently lead wires 36 and 38 are bonded to this region by solder fillets 40 and 42.

Next gold layer 24 is applied to the surfaces of wafer 10 and base tab 20. This may be done, for example, by the process described and claimed in United States Patent No. 2,893,929 of G. L. Schnable or by the process described and claimed in United States Patent No. 2,823,175 of J. Roschen. This layer reduces to a low value the resistance between base tab 20 and the portion of web 12 adjoining and exterior to alloy region 18 and hence reduces the series resistance of the diode.

After wafer 10 has been gold plated, it may be rinsed, etched if desired in a conventional acid etch, e.g., CP–4, and encapsulated in conventional manner.

In the preceding example the semiconductive wafer 10 has been described as composed of n-type germanium. However it may be composed of any other suitable semiconductor, for example p-type germanium, silicon or a compound semiconductor such as gallium arsenide. Appropriate changes in the alloying and soldering metals should be made when these other materials are used.

Moreover region 18 has been described as an alloy region. However this region may alternatively be made by an impurity diffusion process.

The horizontal cross section of region 18 has been described as circular. However it is apparent that this region may have horizontal cross-sections of many different shapes. The essential requirement in accordance with the invention is that the lateral area of region 18 within web 12 shall always be less than the cross-sectional area intersected by region 18 at either surface of web 12. As aforementioned, where this cross section is circular and the alloy region is essentially cylindrical, this requirement is fulfilled when the thickness of region 18 is less than one-fourth of its cross-sectional diameter. Where the cross section of region 18 is an ellipse having a semimajor axis $a$ and a semiminor axis $b$, the thickness of the web must be less than $$ab/(a+b)\left(1+\frac{1}{4}\left[\frac{a-b}{a+b}\right]^2+\frac{1}{64}\left[\frac{a-b}{a+b}\right]^4+\cdots\right)$$

Where region 18 has a rectangular cross section of length $c$ and width $d$, the thickness of the web should be less than $$cd/2(c+d), \text{ and}$$

where the cross section is a square of side $s$, the thickness of region 18 should be less than $s/4$.

Figure 3:
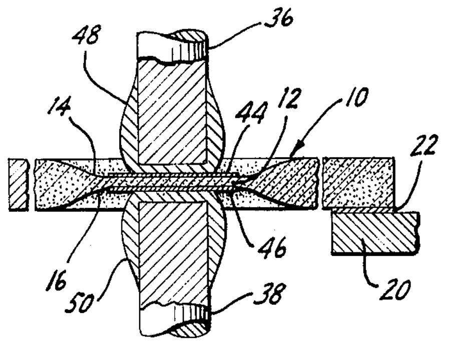
FIGURES 2 and 3 are sectional diagrams of the diode of FIGURE 1 at various stages of its fabrication.

In the diode assembly of FIGURES 1 to 3, two opposing lead wires 36 and 38 provide electrical connections to region 18. The use of the two opposing lead wires has at least two advantages. As aforementioned it prevents an excessively large unbalanced force from being applied to web 12. In addition, the resistance and inductance of the external electrical connection to region 18 can be reduced to one-half of the respective resistance and inductance of a single-wire connection thereto by providing a low-impedance direct connection between stem leads 30 and 34 to which lead wires 36 and 38 are bonded. Nonetheless only a single conductor is required to provide an electrical connection to region 18.

In addition, in fabricating web 12 it is unnecessary to etch wafer 10 on both opposing surfaces. Alternatively it may be etched on only one opposing surface so that only one depressed surface is formed in wafer 10.

Moreover although a tunnel diode has been described in the foregoing example, the invention is not limited to tunnel diodes. On the contrary, mixer diodes and voltage-variable capacitor diodes may have structures according to the invention. Such diodes according to the invention differ from the aforedescribed tunnel diode primarily in that wafer 10 is composed of a semiconductive material having a substantially higher resistivity than the material used in the tunnel diode. Thus in a mixer diode, wafer 10 may be composed for example of monocrystalline n-type germanium having a resistivity of the order of 0.003 to 0.02 ohm-centimeter, or a monocrystalline p-type silicon having a resistivity of the order of 0.01 to 0.04 ohm-centimeter. In a voltage-variable capacitor diode, wafer 10 may be composed of monocrystalline n-type germanium having a resistivity of the order of 0.1 to 1 ohm-centimeter. In all of these types of diodes, alloy region 18 provides a rectifying connection of extremely small area and hence of correspondingly low capacitance.

Figure 4:
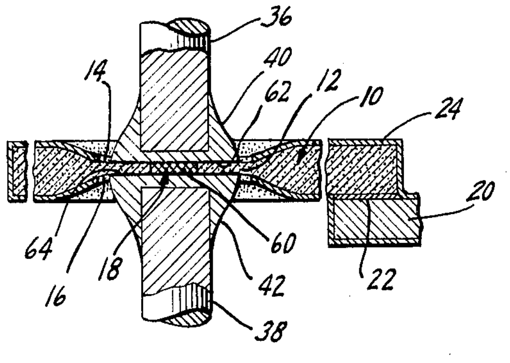
FIGURE 4 is a sectional diagram of a voltage-variable capacitance diode according to the invention.

Another semiconductor device according to the invention is the voltage-variable capacitance diode illustrated in FIGURE 4. The latter diode has a structure similar to the diode shown in FIGURES 1 to 3, and identical numerals have been applied to corresponding components thereof. The difference between the structures of the two diodes is in the resistivity of wafer 10 and the geometry of region 18 within wafer 10. In this regard wafer 10 of the diode of FIGURE 4 typically is composed of monocrystalline n-type germanium having a resistivity of between about 0.1 and 1 ohm-centimeter, and region 18 of the diode has an H-shaped vertical cross-section. Because region 18 has such a cross-section, the diode of FIGURE 4 is capable of changing its capacitance abruptly and by almost two orders of magnitude in response to only a small variation in the value of a control voltage applied thereto. The reason for this is explained hereinafter.

More particularly, as shown in FIGURE 4, region 18 is made up of three parts—a cylindrical p-type region 60 extending completely through web 12 and two disc-shaped micro-alloy regions 62 and 64 which are in good electrical connection with region 60, have a diameter which is larger than that of region 60 and in accordance with the invention is also larger than the thickness of web 12, are substantially coaxial with region 60, are spaced from one another and are substantially parallel to one another.

Region 18 of the diode of FIGURE 4 may be fabricated as follows. Region 60 is formed by jet-electrodepositing coaxial indium dots on the opposing surfaces of web 12 and alloying these into the web until the alloyed regions coalesce. The indium remaining above the surfaces of web 12 is etched off with dilute hydrochloric acid. Then two indium disks of larger diameter than that of region 60 are jet electroplated onto the opposing surfaces of web 12 coaxial with region 60. Two lead wires 36 and 38 having affixed thereto solder globules consisting essentially of indium containing between about 0.1 and 1 percent by weight of gallium are abutted against the indium disks in the manner shown in FIGURE 3. Then the two solder globules are heated, e.g., to about 300° C., until they melt and a mixture forms between the molten globules, the indium disks and a surface portion of the germanium web therebetween. As soon as this mixture forms the heating is discontinued and the mixture and solder cooled below their solidus temperatures. As a result two extremely thin, gallium-rich alloy-junction regions 62 and 64 are formed just beneath the surfaces of web 12. These regions are in good electrical contact with the cylindrical alloy region 60. Concurrently lead wires 36 and 38 are bonded to regions 62 and 64 by solder fillets 40 and 42. Then the resultant structure is gold plated as described above and subjected to conventional cleansing, after which it is encapsulated.

Figure 5:
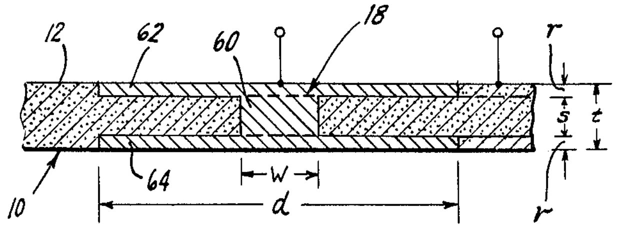
FIGURES 5 to 7 are diagrams employed hereinafter to explain the operation of the diode illustrated in FIGURE 4.
Figure 6:
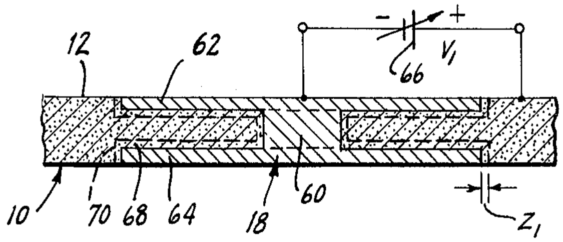
Figure 7:
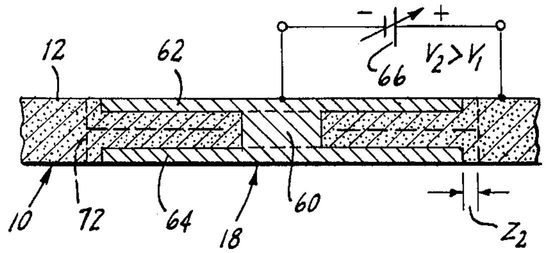

The operation of the diode of FIGURE 4 now is discussed with reference to FIGURES 5 to 7 which represent schematically a greatly magnified portion of web 12 and region 18 of the embodiment of FIGURE 4. As shown in FIGURE 5, web 12 has a thickness $t$ which typically is between about 0.01 and 0.1 mil. The cylindrical region 60 has a diameter $w$ and a height $s$, while each of the disc-like regions 62 and 64 has a diameter $d$ and a thickness $r$. Typically $w$ is about $0.1d$, e.g., $w$ is one mil and $d$ is ten mils, and $r$ is between about 0.0001 mil and 0.001 mil. Since $r$ is at most only about $1/100$ of $t$, the height $s$ of cylindrical region 60 is approximately equal to the thickness $t$ of web 12.

While we do not wish to be bound by any theory, we believe that the diode of FIGURE 4 operates in the following manner. When a small reverse-biasing voltage $V_1$ (see FIGURE 6) is applied between wafer 10 and region 18, for example by a source of variable voltage 66, a very thin layer 68 depleted of minority charge carriers, i.e., a "depletion layer," is formed in web 12 adjacent region 18. The boundary of this layer is indicated in FIGURE 6 by the dashed line 70; as there shown layer 68 has a thickness $z_1$. This depletion layer functions as the "dielectric" of the diode capacitor, one of whose "plates" is the alloy region 18 and the other of whose "plates" is the region of web 12 adjoining the boundary 68 of the depletion layer and remote from alloy region 18. Because $w$ is much smaller than $d$, and $z_1$ is small compared to $s$, the area of either one of these "plates" is approximately $(\frac{1}{2}\pi d^2)$. The capacitance of the diode is directly proportional to this area.

As the reverse-biasing voltage applied between wafer 10 and region 18 is increased, the depletion layer 68 widens gradually and hence the capacitance of the diode decreases gradually. However when the reverse-biasing voltage attains a critical value $V_2$ (see FIGURE 7) such that the depletion layer adjoining upper alloy region 62 and the depletion layer adjoining lower alloy region 64 merge into a single depletion region extending between the two alloy regions, the capacitance of the diode falls abruptly to a much smaller value. This abrupt fall in capacitance occurs because the only portion of web 12 effective as a "plate" of the capacitor is that adjoining the lateral boundary 72 of the depletion layer, and this lateral boundary has an area much less than $(\frac{1}{2}\pi d^2)$. In particular since the width $z_2$ of the depletion layer is in practice much less than $d$, the lateral area of the depletion layer is approximately $(\pi dt)$. Thus the quotient of the capacitance of the diode for reverse-biasing voltages smaller than $V_2$ divided by the capacitance for reverse-biasing voltages equal to or greater than this value is approximately equal to $(\frac{1}{2}\pi d^2/\pi dt)$ or $(d/2t)$. Accordingly where for example $d$ equals ten mils and $t$ equals 0.05 mil, the capacitance of the diode for voltages greater than $V_2$ is only about $\frac{1}{100}$ of the diode capacitance for voltages less than $V_2$. Thus because of the shape of region 18, the diode of FIGURE 4 is capable of abrupt, large changes in capacitance in response to relatively small changes in the reverse-biasing voltage. Such a diode is particularly well suited for use in parametric amplification systems, harmonic generators and frequency modulation devices.

The structure of the voltage-variable capacitance diode just described may be varied in many ways from the foregoing. For example wafer 10 need not be composed of n-type germanium but may be made of p-type germanium, n- or p-type silicon or an intermetallic semiconductor. The disk-like regions 62 and 64 need not be microalloy regions, but alternatively may be regions alloyed more deeply into the body than are microalloy regions or regions which are not alloyed at all into the body, e.g., surface-barrier rectifier electrodes. The specific way in which the diode capacitance varies in response to variations in the reverse-biasing voltage can be controlled by varying the thickness of web 12, the relative dimensions of the three regions 60, 62 and 64 or the resistivity of semiconductor wafer 10, or by varying combinations of these parameters. In addition the opposing surfaces of web 12 need not be parallel. For example these surfaces may be coaxially concave, so that the surfaces are closest to each other along the axis of their concavity. Under these conditions, region 18 may be formed by applying to each opposing surface of web 12 a dot of impurity metal centered on said axis, and then alloying these dots into web 12 just enough to cause the two alloyed regions to merge at their point of closest approach and be separated from each other everywhere else. In still other forms, one surface of web 12 may be plane and the other concave, or one surface may be convex and the other coaxially concave therewith, with the convex surface having a less pronounced curvature than the concave surface.

While we have described our invention by means of specific examples and in specific embodiments, we do not wish to be limited thereto, for obvious modifications will occur to those skilled in the art without departing from the scope of our invention.

What we claim is:

1. A semiconductor device comprising a body of semiconductive material having opposing surfaces spaced by a distance of between about 0.01 mil and about 0.1 mil and also comprising a recrystallized alloy region extending continuously between and intersecting both of said opposing surfaces, said region having a conductivity type opposite that of the portion of said body adjoining said region and a surface area within said body less than the area of the surface of intersection of said region and either of said opposing surfaces, said region and said adjoining portion of said body forming a p-n junction therebetween.

2. A device according to claim 1, wherein said opposing surfaces are substantially parallel to each other, wherein said surfaces of intersection are substantially circular, and wherein the distance between said opposing surfaces is less than one-fourth of the diameter of either of said surfaces of intersection.

3. A diode comprising a wafer of semiconductive material of one conductivity type, said wafer comprising a web of said semiconductive material thinner than the remainder of said wafer and having opposing surfaces spaced by a distance of between about 0.01 mil and about 0.1 mil, said diode also comprising a recrystallized alloy region of conductivity type opposite said one type extending continuously through said web and intersecting both of said opposing surfaces, said region having a surface area within said web less than the area of the surface of intersection of said region and either of said opposing surfaces, and said region and the portion of said web adjoining said region forming a p-n junction therebetween.

4. A diode according to claim 3, additionally comprising means for reducing the electrical resistance of a surface portion of said wafer, said surface portion extending continuously between a part of said wafer located outside said region and a line on one of said web surfaces adjacent but spaced from the surface of intersection of said one surface and said region.

5. A diode according to claim 4, in which said resistance-reducing means comprises a coating on said surface portion of said wafer of a substance having an electrical conductivity substantially higher than that of said surface portion.

6. A semiconductor device comprising a body of semiconductive material of given conductivity type having two substantially plane and parallel surfaces separated by a given distance, first and second substantially coaxial disk-shaped regions respectively formed in said two surfaces and spaced from one another, each of said regions having a diameter greater than four times said given distance and a conductivity type opposite said given type, and a substantially cylindrical third region of the same conductivity type as that of said first and second regions, coaxial with, extending continuously between and intersecting said first and second regions, said cylindrical region having a diameter less than the diameter of either of said first and second regions, said three regions and the portion of said body adjoining said three regions forming a p-n junction between said portion and said three regions.

7. A diode according to claim 6, additionally comprising means for reducing the electrical resistance of a surface portion of said wafer, said surface portion extending continuously between a part of said wafer located outside said three regions and a line positioned on a surface of said body, said line being spaced from said three regions and closer to one of said first and second regions than is said part of said wafer.

8. A device according to claim 1, wherein said opposing surfaces are substantially parallel to each other and wherein said surfaces of intersection are substantially circular and have a diameter of between about one mil and about ten mils.

9. A diode according to claim 3, wherein said opposing surfaces are substantially parallel and said region is substantially circularly cylindrical and has a diameter of between about one mil and about ten mils.

10. A semiconductor device according to claim 6, wherein said two disk-shaped regions have the same diameter.

11. A semiconductor device according to claim 6, wherein said given distance is between about 0.01 mil and about 0.1 mil, said disk-shaped regions have the same diameter, and said diameter of said cylindrical region is about one-tenth said diameter of said disk-shaped regions.

12. A semiconductor device comprising a body of semiconductive material of given conductivity type having two substantially plane and parallel surfaces separated by a given distance, first and second substantially coaxial disk-shaped regions respectively formed in said two surfaces and spaced from each other, each of said regions having a diameter greater than said given distance and a conductivity type opposite said given type, and a substantially cylindrical third region of the same conductivity type as that of said first and second regions, coaxial with, extending continuously between and intersecting said first and second regions, said cylindrical region having a diameter less than the diameter of either of said first and second regions, said three regions and the portion of said body adjoining said three regions forming a p-n junction between said portion and said three regions.

13. A device according to claim 12, wherein said third region is composed of a recrystallized alloy comprising said semiconductive material and an impurity substance of impurity type opposite that predominant in said adjoining portion of said body.

References Cited by the Examiner

UNITED STATES PATENTS

| | | | |
|---|---|---|---|
| 2,829,075 | 4/1958 | Pankove | 317—235 |
| 2,898,247 | 8/1959 | Hunter | 148—1.5 |
| 2,900,286 | 8/1959 | Goldstein | 148—1.5 |
| 2,927,222 | 3/1960 | Turner | 317—235 |
| 2,937,114 | 5/1960 | Shockley | 317—235 |
| 2,942,166 | 6/1960 | Michlin | 317—234 |
| 2,952,804 | 9/1960 | Franke | 317—235 |
| 2,954,307 | 9/1960 | Shockley | 317—235 |
| 2,967,985 | 1/1961 | Shockley | 317—235 |
| 2,983,854 | 5/1961 | Pearson | 317—235 |
| 3,105,177 | 9/1963 | Aigrain et al. | 317—234 |

DAVID J. GALVIN, *Primary Examiner.*

SAMUEL BERNSTEIN, GEORGE N. WESTBY, *Examiners.*